(12) United States Patent
Chiu

(10) Patent No.: US 11,171,087 B1
(45) Date of Patent: Nov. 9, 2021

(54) SEMICONDUCTOR STRUCTURE AND CONTROLLING METHOD THEREOF

(71) Applicant: NANYA TECHNOLOGY CORPORATION, New Taipei (TW)

(72) Inventor: Hsih-Yang Chiu, Taoyuan (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 16/868,304

(22) Filed: May 6, 2020

(51) Int. Cl.
*H01L 23/525* (2006.01)
*H01L 27/085* (2006.01)
*H01L 27/112* (2006.01)

(52) U.S. Cl.
CPC ...... *H01L 23/5252* (2013.01); *H01L 23/5256* (2013.01); *H01L 27/085* (2013.01); *H01L 27/11206* (2013.01)

(58) Field of Classification Search
CPC . H01L 23/5252; H01L 23/5256; H01L 23/62; H01L 27/085; H01L 27/11206
See application file for complete search history.

(56) References Cited

U.S. PATENT DOCUMENTS

| | | | | |
|---|---|---|---|---|
| 2007/0181969 A1* | 8/2007 | Kim | ...................... | H01L 27/112 257/529 |
| 2007/0205485 A1* | 9/2007 | Hsu | ...................... | H01L 27/1203 257/530 |
| 2007/0278580 A1* | 12/2007 | Kondo | ................ | H01L 27/0251 257/355 |
| 2007/0278615 A1* | 12/2007 | Kushiyama | ............ | G11C 17/18 257/529 |
| 2008/0042235 A1* | 2/2008 | Kodama | ........... | H01L 27/11206 257/530 |
| 2011/0317467 A1* | 12/2011 | Nagayama | ........... | G11C 17/165 365/94 |
| 2014/0210043 A1* | 7/2014 | Wang | ..................... | G11C 17/16 257/530 |

* cited by examiner

*Primary Examiner* — Eduardo A Rodela
(74) *Attorney, Agent, or Firm* — Muncy, Geissler, Olds & Lowe, P.C.

(57) ABSTRACT

The present disclosure provides a semiconductor structure employing an antifuse structure and a controlling method of the semiconductor structure. The semiconductor structure includes a semiconductor substrate, a transistor and an antifuse structure. The transistor is disposed on the semiconductor substrate. The antifuse structure is disposed on the semiconductor substrate and adjacent to the transistor. The antifuse structure includes a first conductive portion, a fusible portion and a second conductive portion. The first conductive portion is disposed in the semiconductor substrate. The fusible portion is disposed on the first conductive portion. The second conductive portion is disposed on the fusible portion. The antifuse structure encloses the transistor in a top view.

19 Claims, 20 Drawing Sheets

SEMICONDUCTOR STRUCTURE AND CONTROLLING METHOD THEREOF

TECHNICAL FIELD

The present disclosure relates to a semiconductor structure and a controlling method thereof, and more particularly, to a semiconductor structure and a controlling method thereof employing and antifuse structure.

DISCUSSION OF THE BACKGROUND

Antifuse elements are a widely used feature in integrated circuits for a variety of purposes, such as improving manufacturing yield or customizing a generic integrated circuit. For example, by replacing defective circuits on a chip with duplicate or redundant circuits on the same chip, manufacturing yields can be significantly increased. An antifuse disconnected by a laser beam is referred to as a laser antifuse, while an antifuse disconnected by passing an electrical current, or blowing, is referred to as an electrical antifuse, or e-antifuse. An integrated circuit designed with antifuses that can be selectively blown may be economically manufactured and adapted to a variety of custom uses.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure includes a semiconductor substrate, a transistor and an antifuse structure. The transistor is disposed on the semiconductor substrate. The antifuse structure is disposed on the semiconductor substrate and adjacent to the transistor. The antifuse structure includes a first conductive portion, a fusible portion and a second conductive portion. The first conductive portion is disposed in the semiconductor substrate. The fusible portion is disposed on the first conductive portion. The second conductive portion is disposed on the fusible portion. The antifuse structure encloses the transistor in a top view.

In some embodiments, the semiconductor structure further includes a ground electrode structure and a driving electrode structure. The ground electrode structure is disposed on the semiconductor substrate and electrically connected to the transistor. The driving electrode structure is disposed on the semiconductor substrate and electrically connected to the transistor.

In some embodiments, the ground electrode structure encloses the antifuse structure and the transistor.

In some embodiments, the antifuse structure encloses the ground electrode structure and the transistor.

In some embodiments, the ground electrode structure is provided with a ground voltage and the driving electrode structure is provided with a driving voltage.

In some embodiments, the first conductive portion of the antifuse structure encloses the transistor in the top view.

In some embodiments, when the fusible portion is ruptured, the second conductive portion and the semiconductor substrate are electrically connected.

In some embodiments, when the fusible portion is ruptured, a first current flowing in the transistor is changed to a second current, wherein the second current is less than the first current.

Another aspect of the present disclosure provides a semiconductor structure including a semiconductor substrate, a transistor and an antifuse structure. The transistor is disposed on the semiconductor substrate. The antifuse structure is disposed on the semiconductor substrate and adjacent to the transistor. The antifuse structure includes a first conductive portion, a fusible portion and a second conductive portion. The first conductive portion is disposed in the semiconductor substrate. The fusible portion is disposed on the first conductive portion. The second conductive portion is disposed on the fusible portion. When the antifuse structure is changed from a first state to a second state, a first current flowing in the transistor is changed to a second current, wherein the second current is less than the first current.

In some embodiments, the semiconductor structure further includes a ground electrode structure and a driving electrode structure. The ground electrode structure is disposed on the semiconductor substrate and electrically connected to the transistor. The driving electrode structure is disposed on the semiconductor substrate and electrically connected to the transistor.

In some embodiments, the ground electrode structure encloses the antifuse structure and the transistor.

In some embodiments, the antifuse structure encloses the ground electrode structure and the transistor.

In some embodiments, the ground electrode structure is provided with a ground voltage and the driving electrode structure is provided with a driving voltage.

In some embodiments, the first conductive portion of the antifuse structure encloses the transistor in the top view.

In some embodiments, when the fusible portion is ruptured, the antifuse structure is changed from the first state to the second state.

Another aspect of the present disclosure provides a controlling method of a semiconductor structure. The semiconductor structure comprises a transistor and an antifuse structure. The method includes: providing a ground voltage to the transistor; providing a first voltage to the antifuse structure; and changing the first voltage to a second voltage and changing the ground voltage to a driving voltage. When the second voltage is provided to the antifuse structure, a first current flowing in the transistor corresponding to the driving voltage is changed to a second current, wherein the second current is less than the first current.

In some embodiments, when the second voltage is provided to the antifuse structure, the antifuse structure is changed from a first state to a second state.

In some embodiments, when the antifuse structure is in the second state, a fusible portion of the antifuse structure is ruptured.

In some embodiments, before the providing of the ground voltage to the transistor, the driving voltage is provided to the transistor.

In some embodiments, when the first voltage is provided to the antifuse structure, the driving voltage is changed to the ground voltage.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

Figure 1:
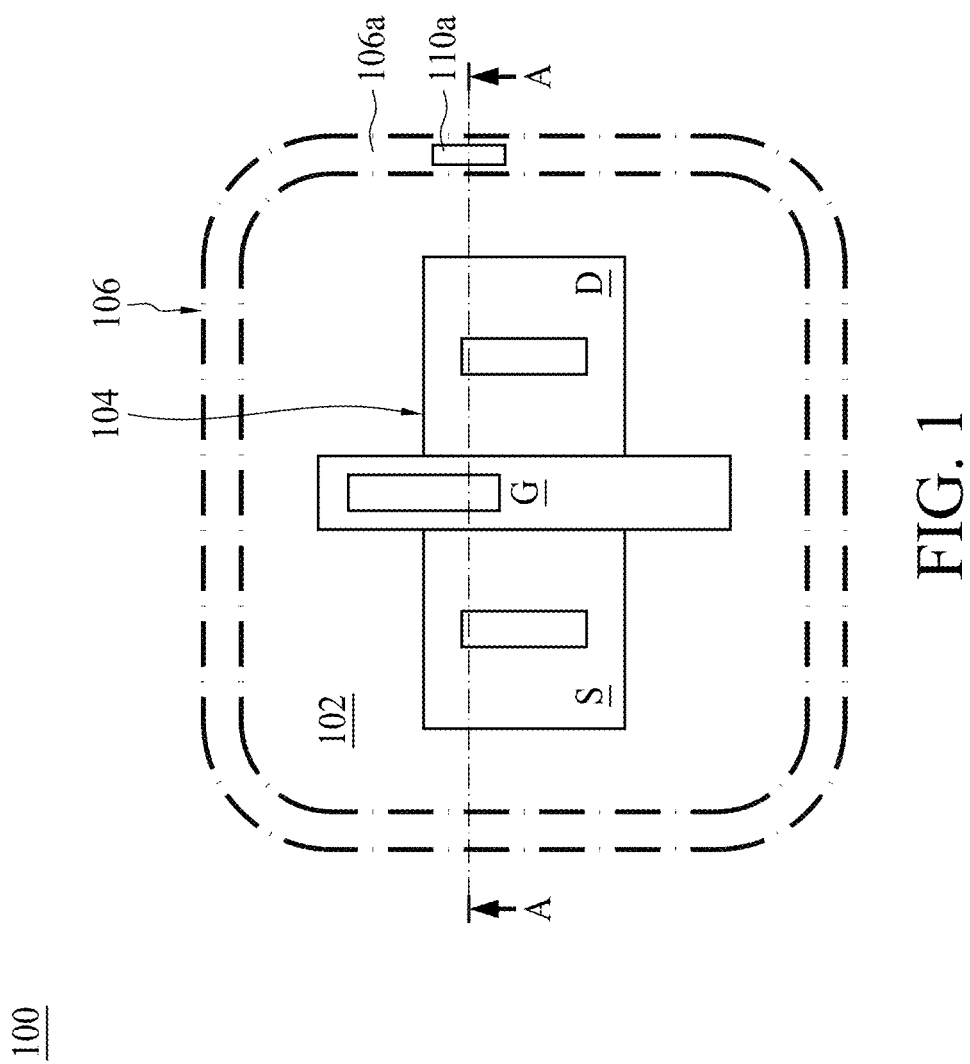
FIG. 1 is a top view of a semiconductor structure in accordance with some embodiments of the present disclosure.

Embodiments, or examples, of the disclosure illustrated in the drawings are now described using specific language. It shall be understood that no limitation of the scope of the disclosure is hereby intended. Any alteration or modification of the described embodiments, and any further applications of principles described in this document, are to be considered as normally occurring to one of ordinary skill in the art to which the disclosure relates. Reference numerals may be repeated throughout the embodiments, but this does not necessarily mean that feature(s) of one embodiment apply to another embodiment, even if they share the same reference numeral.

It shall be understood that, although the terms first, second, third, etc. may be used herein to describe various elements, components, regions, layers or sections, these elements, components, regions, layers or sections are not limited by these terms. Rather, these terms are merely used to distinguish one element, component, region, layer or section from another element, component, region, layer or section. Thus, a first element, component, region, layer or section discussed below could be termed a second element, component, region, layer or section without departing from the teachings of the present inventive concept.

The terminology used herein is for the purpose of describing particular example embodiments only and is not intended to be limited to the present inventive concept. As used herein, the singular forms "a," "an" and "the" are intended to include the plural forms as well, unless the context clearly indicates otherwise. It shall be further understood that the terms "comprises" and "comprising," when used in this specification, point out the presence of stated features, integers, steps, operations, elements, or components, but do not preclude the presence or addition of one or more other features, integers, steps, operations, elements, components, or groups thereof.

It should be understood that similar features in FIGS. 3, 5 to 9 and 11 to 20 are identified by the same reference numerals for clarity and simplicity. Furthermore, similar elements in FIGS. 3, 5 to 9 and 11 to 20 can include similar materials, and thus descriptions of such details are omitted in the interest of brevity.

Figure 2:
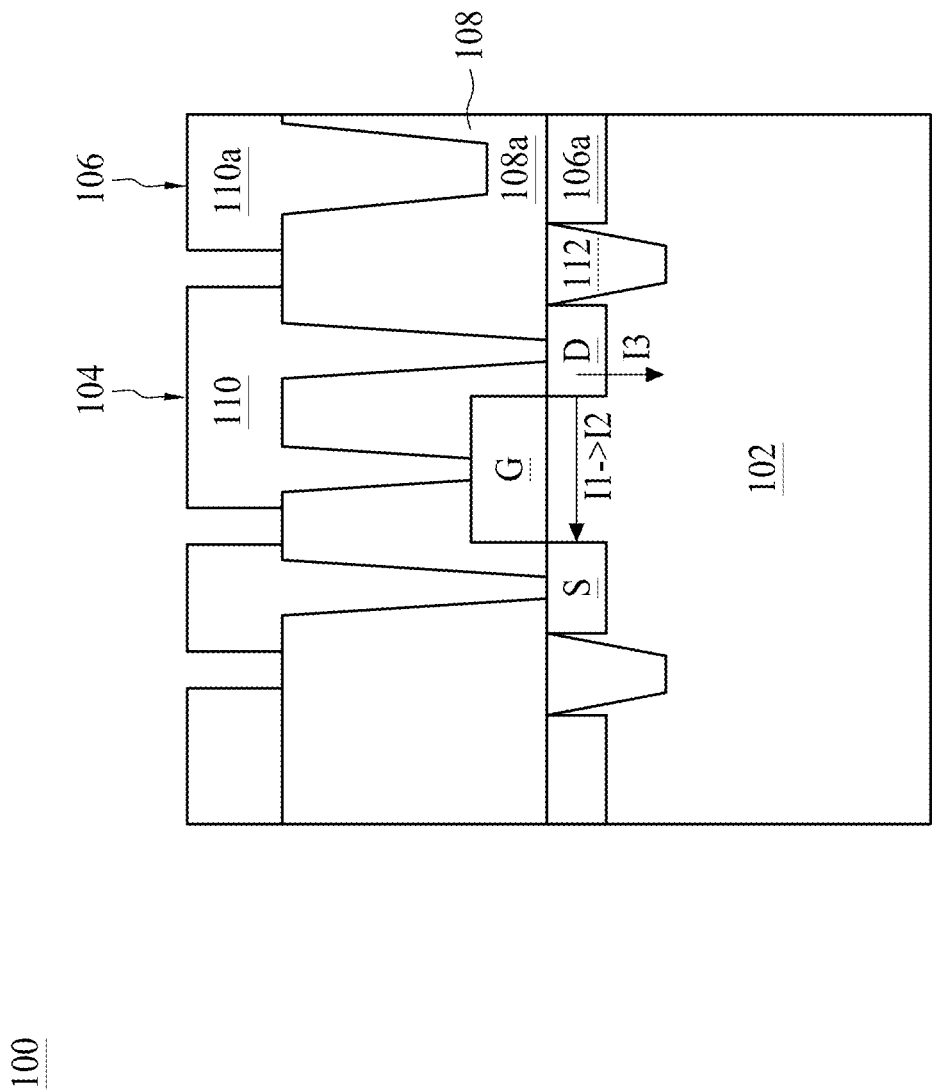
FIG. 2 is a cross-sectional view of the semiconductor structure along a line A-A in FIG. 1.

In accordance with some embodiments of the present disclosure, FIG. 1 is a top view of a semiconductor structure 100 and FIG. 2 is a cross-sectional view of the semiconductor structure 100 along a line A-A in FIG. 1. With reference to FIG. 1 and FIG. 2, in some embodiments, the semiconductor structure 100 includes a semiconductor substrate 102, a transistor 104 and an antifuse structure 106. In some embodiments, the semiconductor structure 100 further includes an insulating layer 108, a contact plug layer 110 and a shallow trench isolation (STI) region 112.

In some embodiments, the semiconductor substrate 102 may be made of semiconductor materials, and the semiconductor substrate 102 may be, but is not limited to, bulk silicon, a semiconductor wafer, a silicon-on-insulator (SOI) substrate, or a silicon germanium substrate. Other semiconductor materials including group III, group IV, and group V elements may also be used.

In some embodiments, the transistor 104 is disposed on the semiconductor substrate 102. It should be noted that the transistor 104 may have some portions formed in the semiconductor substrate 102 and some portions formed on the semiconductor substrate 102. The transistor 104 may be a metal-oxide semiconductor transistor (MOS transistor) or another suitable transistor. In some embodiments, the transistor 104 may be an NMOSFET or a PMOSFET. The transistor 104 includes a gate electrode G, a source electrode S and a drain electrode D.

As an example, the transistor 104 is described hereinafter as an NMOSFET. The semiconductor substrate 102 may be a P-type semiconductor substrate. In other words, the semiconductor substrate 102 may work as a P-well. The gate electrode G may be formed of a polysilicon or a metal. The source electrode S and the drain electrode D are N-type diffusion regions such as arsenic implantation regions. In some embodiments, a gate dielectric layer (not shown) is formed between the gate electrode G and the semiconductor substrate 102. The gate dielectric layer may be oxide or low dielectric constant material.

In some embodiments, the antifuse structure 106 is disposed on the semiconductor substrate 102 and adjacent to the transistor 104. In some embodiments, the antifuse structure 106 includes a first conductive portion 106a, a fusible portion 108a and a second conductive portion 110a.

In some embodiments, the antifuse structure 106 encloses the transistor 104 in a top view (as shown, for example, in FIG. 1). In other words, the antifuse structure 106 may have a closed shape and the transistor 104 is formed inside the closed shape in the top view. In some other embodiments, the antifuse structure 106 may not be a closed shape and the antifuse structure 106 still surrounds the transistor 104. In other words, the transistor 104 is disposed inside the non-closed antifuse structure 106 in the top view.

The first conductive portion 106a may be a P-type diffusion region. It should be noted that the conductive type of the first conductive portion 106a is related to the type of the transistor 104. For example, when the transistor 104 is a PMOSFET, the first conductive portion 106a may be an N-type diffusion region. In some embodiments, the first conductive portion 106a of the antifuse structure 106 encloses the transistor 104 in the top view. As mentioned above, the first conductive portion 106a may have a closed shape or a non-closed shape. In some embodiments, the shape of the first conductive portion 106a may be a ring, a circle, a rectangle, a square, or another suitable shape.

In some embodiments, the fusible portion 108a is formed with the insulating layer 108. The thickness of the fusible portion 108a may be related to the electric field for rupturing the fusible portion 108a and input voltage, as described by equation (1).

$$E = V/d \qquad (1)$$

Where E is electric field, V is input voltage and d is the thickness of the fusible portion 108a.

In some embodiments, the electric field E for rupturing the fusible portion 108a is equal to or greater than 8 mV/cm. In some other embodiments, the electric field E for rupturing the fusible portion 108a may be equal to or greater than 10 mV/cm. In some embodiments, the input voltage V for rupturing the fusible portion 108a may be between about 4.2V and about 5V. In some other embodiments, the input voltage V for rupturing the fusible portion 108a may be about 6V. The thickness of the fusible portion 108a may be different depending on the material of the fusible portion 108a (i.e., the insulating layer 108). For example, when the material of the fusible portion 108a is more sensitive to the input voltage (or the electric field), the thickness of the fusible portion 108a may be less.

The second conductive portion 110a is formed with the contact plug layer 110. In some embodiments, the input voltage is provided from the second conductive portion 110a. When the fusible portion 108a is ruptured (or blown out) by the input voltage, the antifuse structure 106 is changed from a first state to a second state. The first state is one in which the second conductive portion 110a is electrically isolated from the first conductive portion 106a by the fusible portion 108a. The second state is one in which the second conductive portion 110a is electrically connected to the first conductive portion 106a.

It should be noted that any location on the first conductive portion 106a has a same potential in relation to the transistor 104. In other words, the fusible portion 108a and the second conductive portion 110a may be formed at any location along the first conductive portion 106a. The quantity and location of the fusible portion 108a and the second conductive portion 110a are not limited.

Figure 3:
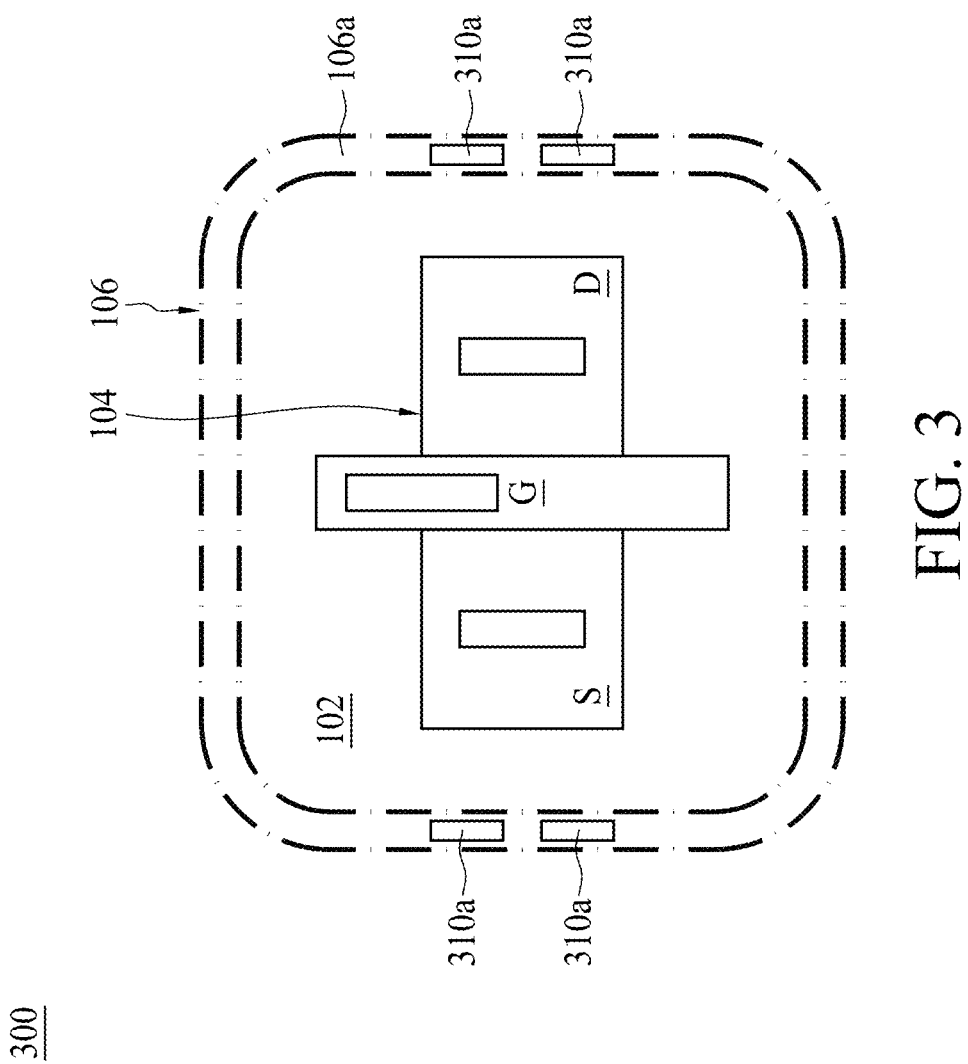
FIG. 3 is a top view of a semiconductor structure in accordance with some embodiments of the present disclosure.

In accordance with some other embodiments of the disclosure, FIG. 3 is a top view of a semiconductor structure 300. Referring to FIG. 3, for example, but not limited to, the semiconductor structure 300 may have four second conductive portions 310a located on the left side and right side of the transistor 104. It should be understood that the quantity and location of the fusible portions (not shown in FIG. 3) correspond to the second conductive portions 310a.

Referring back to FIG. 1 and FIG. 2, in some embodiments, when the fusible portion 108a is ruptured, the second conductive portion 110a and the semiconductor substrate 102 are electrically connected. In other words, the input voltage from the second conductive portion 110a of the antifuse structure 106 may influence the current flowing through the semiconductor substrate 102 between the source electrode S and the drain electrode D of the transistor 104. In some embodiments, when the fusible portion 108a is ruptured, a first current I1 flowing in the transistor 104 is changed to a second current I2. The second current I2 is less than the first current I1. The current drop in the transistor 104 may be conducted from the semiconductor substrate 102. This is because when the potential level of the semiconductor substrate 102 becomes more negative (as in an NMOSFET), more holes are attracted to the semiconductor substrate 102. The threshold voltage of the transistor 104 is increased and the holes may be attracted to the drain electrode D. When the transistor 104 is turned on, a leakage current I3 may occur between the drain electrode D and the semiconductor substrate 102. This effect is called the body effect. As a result, whether the antifuse structure 106 is ruptured or not may be determined from the current flowing in the transistor 104.

In some embodiments, the insulating layer 108 is disposed on the semiconductor substrate 102 and covers the transistor 104. The insulating layer 108 may include dielectric materials, such as oxide, nitride, polymer or the like. In some embodiments, contact holes are formed in the insulating layer 108.

In some embodiments, the contact plug layer 110 is formed on the insulating layer 108. The contact plug layer 110 extends into the contact holes of the insulating layer 108. The contact plug layer 110 is used to electrically connect the transistor 104 and antifuse structure 106 to other electrical elements. In some embodiments, the contact plug layer 110 is formed by filling the contact holes with conductive material such as tungsten (W), gold (Au), silver (Ag), another suitable conductive material, or a combination thereof. In some embodiments, the STI region 112 is formed between the transistor 104 and the antifuse structure 106. The STI region 112 is used for electrically isolating the transistor 104 and the antifuse structure 106 in the semiconductor substrate 102.

Figure 4:
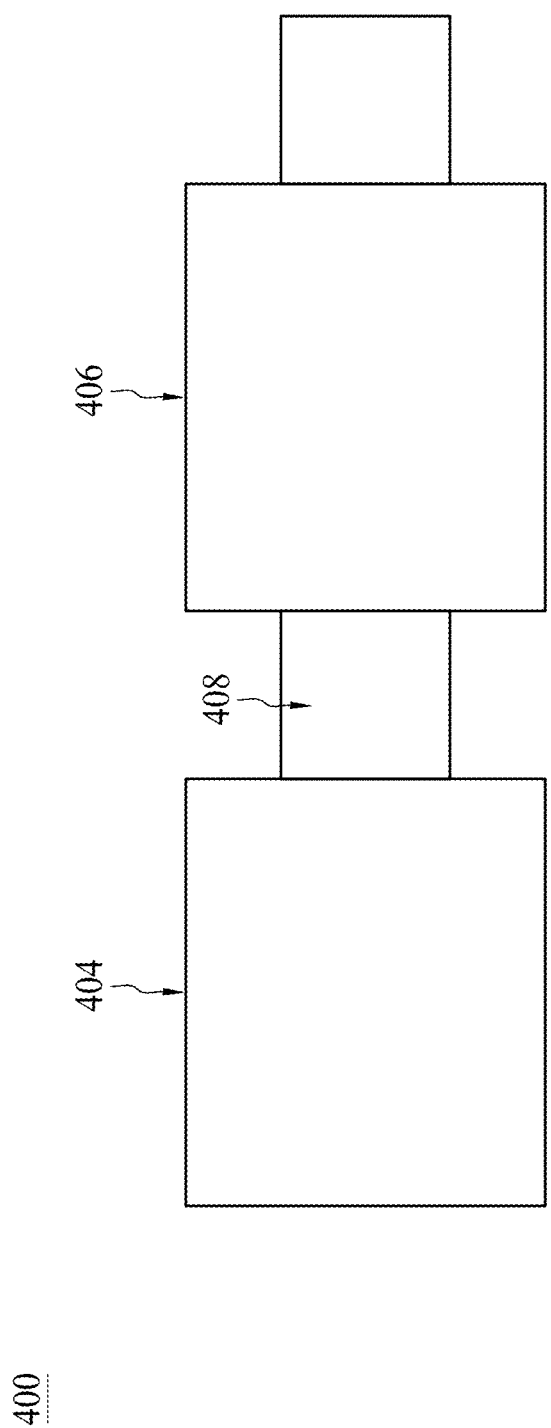
FIG. 4 is a top view of a comparative semiconductor structure.

FIG. 4 is a top view of a comparative semiconductor structure 400. With reference to FIG. 4, the semiconductor structure 400 includes a transistor 404 and an antifuse structure 406. The transistor 404 and the antifuse structure 406 are connected by a conductive layer 408. In the comparative semiconductor structure 400, the antifuse structure 406 may have the same configuration as the transistor 404. Each of the transistor 404 and the antifuse structure 406 has a polysilicon layer serving as a gate electrode and a thin gate oxide for electrically isolating the polysilicon layer from the conductive layer 408 underneath.

The antifuse structure 406 serves as a capacitor before being ruptured. After the thin gate oxide of the antifuse structure 406 is ruptured, the antifuse structure 406 serves as a resistor connected to the transistor 404.

The comparative semiconductor structure 400 may have some issues as described below. The antifuse structure 406 has the same configuration as the transistor 404 and occupies the same area as the transistor 404. Further, in the comparative semiconductor structure 400, one antifuse structure 406 corresponds to one transistor 404. Thus, the dimension of the semiconductor structure 400 may be increased when the density of the antifuse structure 406 is increased.

Moreover, in the comparative semiconductor structure 400, the antifuse structure 406 has only one contact, that is the gate electrode of the antifuse structure 406, for rupturing the thin gate oxide. As a result, when the thin gate oxide is not completely ruptured through the gate electrode, the antifuse structure 406 is not re-fusible. Further, when the antifuse structure 406 is substantially ruptured but is determined to be non-ruptured, there is no alternative way to detect or rupture the antifuse structure 406.

Referring back to FIG. 1 and FIG. 2, compared to the comparative semiconductor structure 400 in FIG. 4, the semiconductor structure 100 of the present disclosure includes the antifuse structure 106 enclosing the transistor 104 in a top view. The area of the antifuse structure 106 may be less than the area of the comparative antifuse structure 406 in FIG. 4. Thus, the dimension of the semiconductor structure 100 may be decreased compared to the comparative semiconductor structure 400.

Moreover, the antifuse structure 106 can have a plurality of second conductive portions 110a and may be ruptured through any one of the second conductive portions 110a. In other words, when the fusible portion 106a is not ruptured through one of the second conductive portions 110a, the fusible portion 106a can be alternatively ruptured through another second conductive portion 110a.

Further, the input voltage from the second conductive portion 110a of the antifuse structure 106 may influence the current flowing through the semiconductor substrate 102 between the source electrode S and the drain electrode D of the transistor 104. As a result, whether the antifuse structure 106 is ruptured or not may be determined from the current flowing in the transistor 104. Specifically, when the fusible portion 108a is ruptured, the first current I1 flowing in the transistor 104 may be changed to the second current I2. The second current I2 is less than the first current I1. The current drop in the transistor 104 may be conducted from the semiconductor substrate 102. This is because when the potential of the semiconductor substrate 102 becomes more negative (as in an NMOSFET), more holes are attracted to the semiconductor substrate 102. The threshold voltage of the transistor 104 is changed and the holes may be attracted to the drain electrode D. When the transistor 104 is turned on, a leakage current I3 may occur between the drain electrode D and the semiconductor substrate 102. This effect is called the body effect. In summary, the antifuse structure 106 is re-fusible and the ruptured state of the antifuse structure 106 is detectable through the current flowing in the transistor 104.

Figure 5:
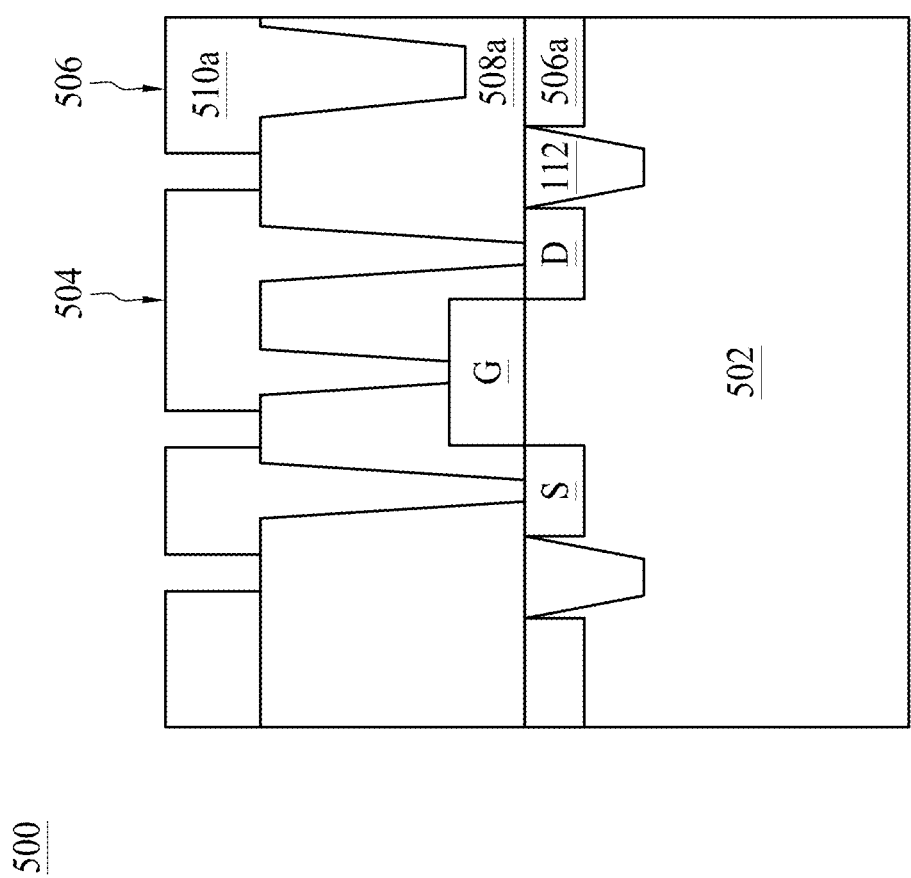
FIG. 5 is a cross-sectional view of the semiconductor structure in FIG. 1 in accordance with another embodiments of the present disclosure.

In accordance with some embodiments of the present disclosure, FIG. 5 is a cross-sectional view of the semiconductor structure 500. With reference to FIG. 5, in some embodiments, the semiconductor structure 500 includes a semiconductor substrate 502, a transistor 504 and an antifuse structure 506.

The difference between the semiconductor structure 500 and the semiconductor structure 100 in FIG. 2 is that the transistor 504 is a PMOSFET. In some embodiments, the semiconductor substrate 502 is an N-type semiconductor substrate. In other words, the semiconductor substrate 502 may work as an N well. The source electrode S and the drain electrode D are P-type diffusion regions.

In some embodiments, the first conductive portion 506a of the antifuse structure 506 is an N-type diffusion region. In some embodiments, the first conductive portion 506a of the antifuse structure 506 encloses the transistor in the top view. As mentioned above, the first conductive portion 506a may have a closed shape or a non-closed shape. In some embodiments, the shape of the first conductive portion 506a may be a ring, a circle, a rectangle, a square, or another suitable shape.

The fusible portion 508a and the second conductive portion 510a are similar to the fusible portion 108a and the second conductive portion 110a in FIG. 2, and repeated description thereof is omitted for brevity.

Similar to the semiconductor structure 100 in FIG. 1 and FIG. 2, the area of the antifuse structure 506 is less than the area of the comparative antifuse structure 406 in FIG. 4. Thus, the dimension of the semiconductor structure 500 is decreased compared to the comparative semiconductor structure 400. Moreover, the antifuse structure 506 may have a plurality of second conductive portions 510a and may be ruptured through any one of the second conductive portions 510a. Further, whether the antifuse structure 506 is ruptured or not may be determined from the current flowing in the transistor 504. In summary, the antifuse structure 506 is re-fusible and the ruptured state of the antifuse structure 506 is detectable through the current flowing in the transistor 504.

Figure 6:
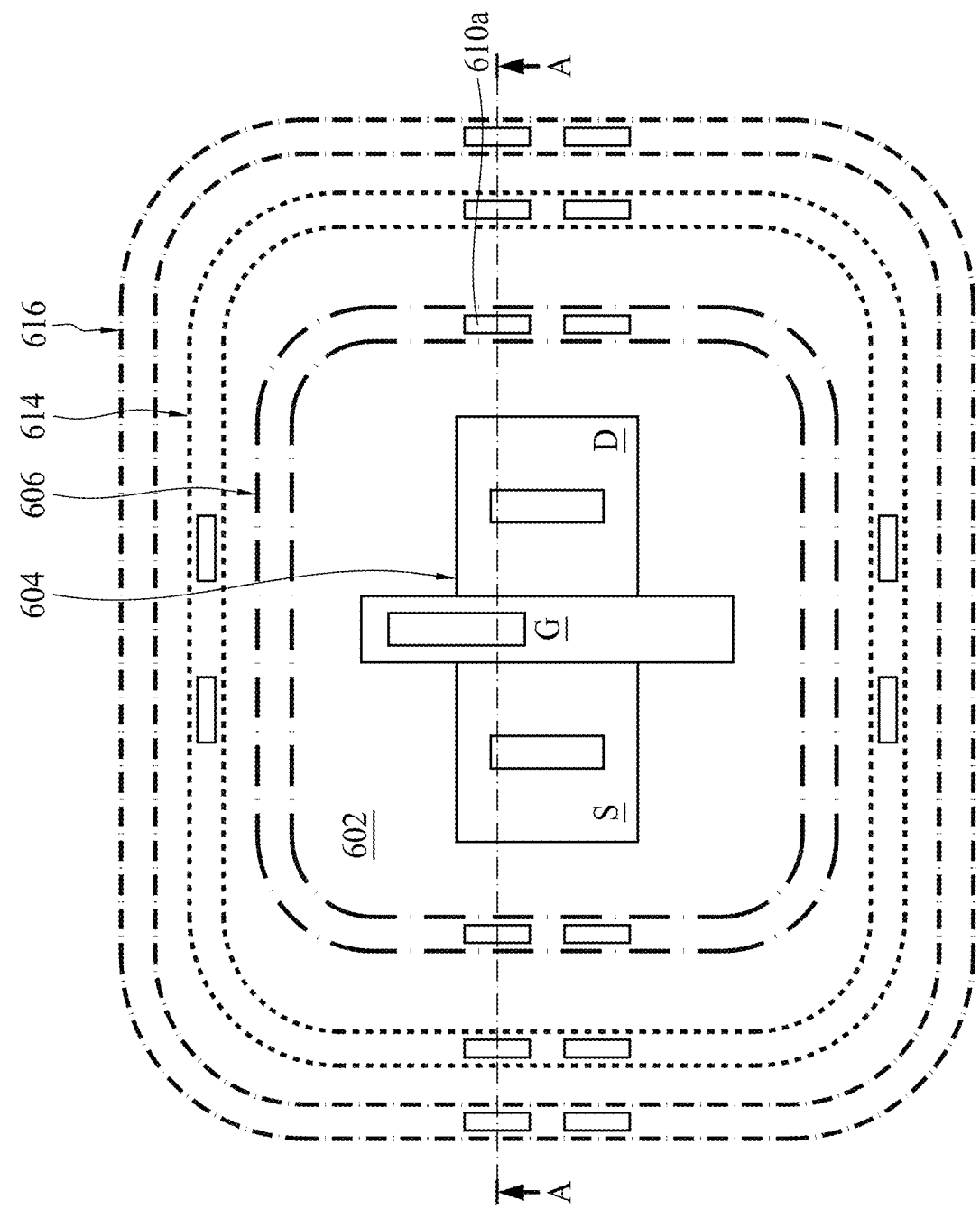
FIG. 6 is a top view of a semiconductor structure in accordance with some embodiments of the present disclosure.
Figure 7:
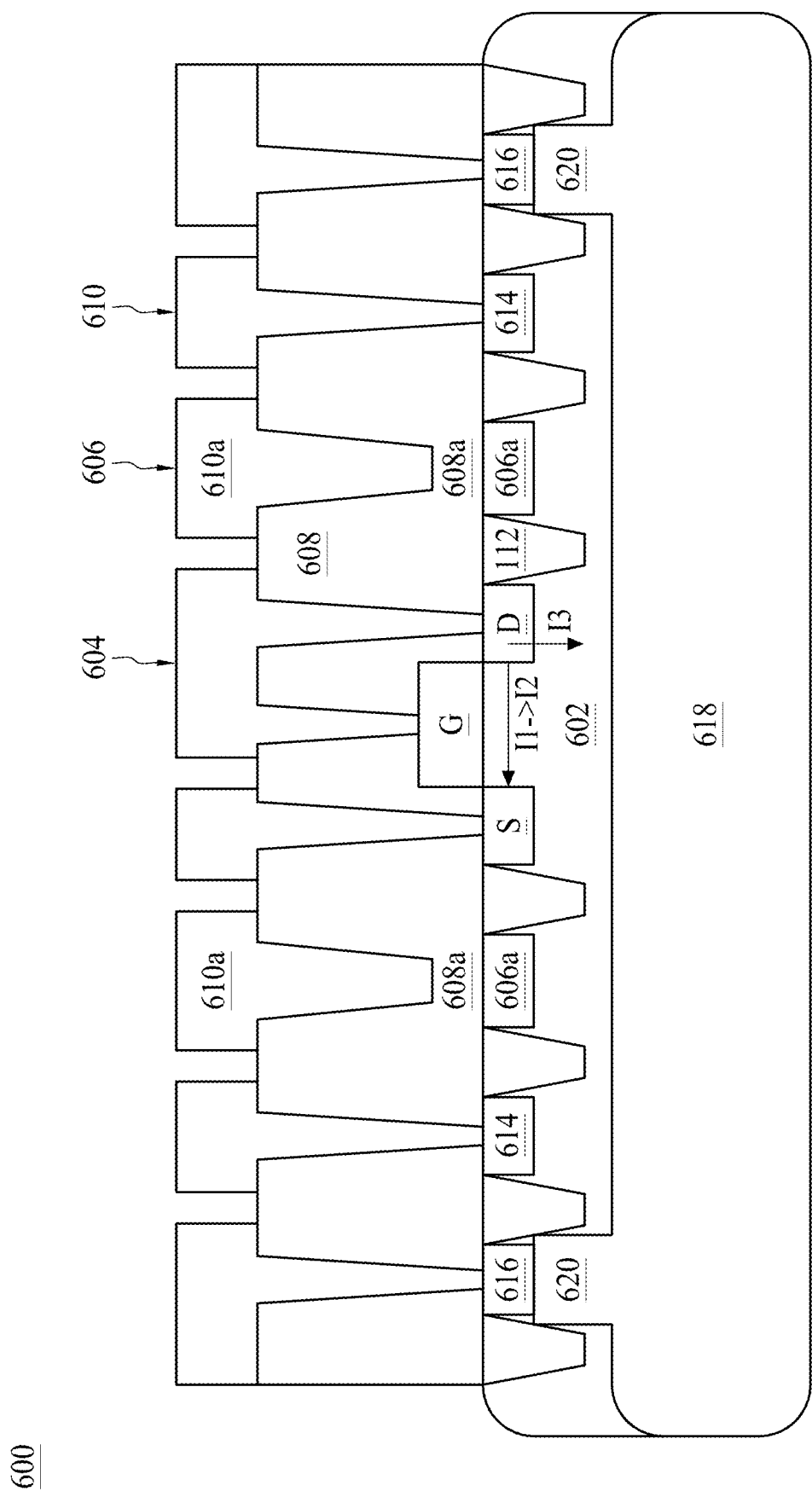
FIG. 7 is a cross-sectional view of the semiconductor structure along a line A-A in FIG. 6.

In accordance with some embodiments of the present disclosure, FIG. 6 is a top view of a semiconductor structure 600 and FIG. 7 is a cross-sectional view of the semiconductor structure 600 along a line A-A in FIG. 6. With reference to FIG. 6 and FIG. 7, in some embodiments, the semiconductor structure 600 includes a semiconductor substrate 602, a transistor 604, an antifuse structure 606, a ground electrode structure 614 and a driving electrode structure 616.

The semiconductor substrate 602, the transistor 604 and the antifuse structure 606 are similar to the semiconductor substrate 102, the transistor 104 and the antifuse structure 106 in FIG. 1 and FIG. 2, and repeated description thereof is omitted for brevity.

As an example, the transistor 604 is described hereinafter as an NMOSFET. The semiconductor substrate 602 may be a P-type semiconductor substrate. In other words, the semiconductor substrate 902 may work as a P-well. The source electrode S and the drain electrode D are N-type diffusion regions such as arsenic implantation regions.

The first conductive portion 606a of the antifuse structure 606 is a P-type diffusion region. It should be noted that the conductive type of the first conductive portion 606a is related to the type of the transistor 604. As mentioned above, the first conductive portion 606a may have a closed shape or a non-closed shape. In some embodiments, the shape of the first conductive portion 606a may be a ring, a circle, a rectangle, a square, or another suitable shape.

The ground electrode structure 614 is provided with a ground voltage. In some embodiments, the ground electrode structure 614 may be a P-type diffusion region. It should be noted that the conductive type of the ground electrode structure 614 is related to the type of the transistor 604. For example, when the transistor 604 is a PMOSFET, the ground electrode structure 614 may be an N-type diffusion region. In some embodiments, the ground electrode structure 614 encloses the transistor 604 and the antifuse structure 606 in the top view. The ground electrode structure 614 may have a closed shape or a non-closed shape. In some embodiments, the shape of the ground electrode structure 614 may be a ring, a circle, a rectangle, a square, or another suitable shape. It should be understood that the shape of the ground electrode structure 614 and the shape of the first conductive portion 606a of the antifuse structure 606 may be the same or different.

The driving electrode structure 616 is provided with a driving voltage. In some embodiments, the driving electrode structure 616 may be an N-type diffusion region. It should be noted that the conductive type of the driving electrode structure 616 is related to the type of the transistor 604. For example, when the transistor 604 is a PMOSFET, the driving electrode structure 616 may be a P-type diffusion region. In some embodiments, the driving electrode structure 616 encloses the transistor 604, the antifuse structure 606 and the ground electrode structure 614 in the top view. The driving electrode structure 616 may have a closed shape or a non-closed shape. In some embodiments, the shape of the driving electrode structure 616 may be a ring, a circle, a rectangle, a square, or another suitable shape. It should be understood that the shapes of the driving electrode structure 616, the ground electrode structure 614 and the first conductive portion 606a of the antifuse structure 606 may be the same or different.

In some embodiments, the semiconductor structure 600 further includes a deep N well 618 and an N well 620. The deep N well 618 is deeper in position than the N well 620, and the N well 620 is more highly doped than the deep N well 620. The deep N well 618 and the N well 620 together provide a better isolation from the P-type substrate 602. In some embodiments, the N well 620 may have the same shape as the driving electrode structure 616 in the top view.

Similar to the semiconductor structure 100 in FIG. 1 and FIG. 2, the area of the antifuse structure 606 is less than the area of the comparative antifuse structure 406 in FIG. 4. Thus, the dimension of the semiconductor structure 600 is decreased compared to the comparative semiconductor structure 400. Moreover, the antifuse structure 606 may have a plurality of second conductive portions 610a and the fusible portion 608a may be ruptured through any one of the second conductive portions 610a. Further, whether the antifuse structure 606 is ruptured or not may be determined from the current flowing in the transistor 604. In summary, the antifuse structure 606 is re-fusible and the ruptured state of the antifuse structure 606 is detectable through the current flowing in the transistor 604.

Figure 8:
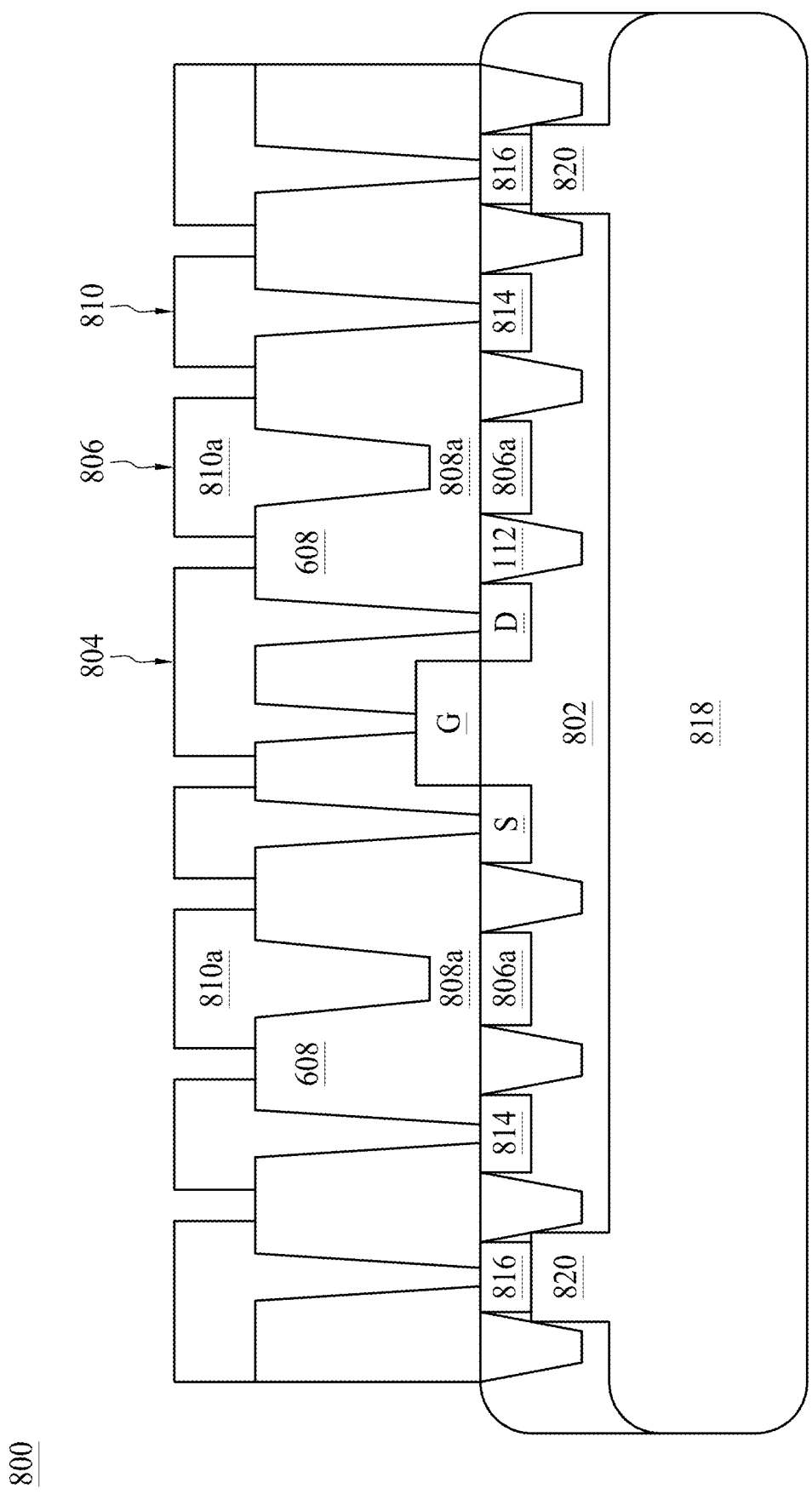
FIG. 8 is a cross-sectional view of the semiconductor structure in FIG. 6 in accordance with another embodiments of the present disclosure.

In accordance with some embodiments of the present disclosure, FIG. 8 is a cross-sectional view of the semiconductor structure 800. With reference to FIG. 8, in some embodiments, the semiconductor structure 800 includes a semiconductor substrate 802, a transistor 804 and an antifuse structure 806.

The difference between the semiconductor structure 800 and the semiconductor structure 600 in FIG. 7 is that the transistor 804 is a PMOSFET. In some embodiments, the semiconductor substrate 802 is an N-type semiconductor substrate. In other words, the semiconductor substrate 802 may work as an N well. The source electrode S and the drain electrode D are P-type diffusion regions.

In some embodiments, the first conductive portion 806a of the antifuse structure 806 is an N-type diffusion region. In some embodiments, the first conductive portion 806a of the antifuse structure 806 encloses the transistor in the top view. As mentioned above, the first conductive portion 806a may have a closed shape or a non-closed shape. In some embodiments, the shape of the first conductive portion 806a may be a ring, a circle, a rectangle, a square, or another suitable shape.

The fusible portion 808a and the second conductive portion 810a are similar to the fusible portion 608a and the second conductive portion 610a in FIG. 7, and repeated description thereof is omitted for brevity.

In some embodiments, the ground electrode structure 814 is an N-type diffusion region and the driving electrode structure 816 is a P-type diffusion region. In some embodiments, the semiconductor structure 800 further includes a deep P well 818 and a P well 820. The deep P well 818 is deeper in position than the P well 820, and the P well 820 is more highly doped than the deep P well 820. The deep P well 818 and the P well 820 together provide a better isolation from the N-type substrate 802. In some embodiments, the P well 820 may have the same shape as the driving electrode structure 816 in the top view.

Figure 9:
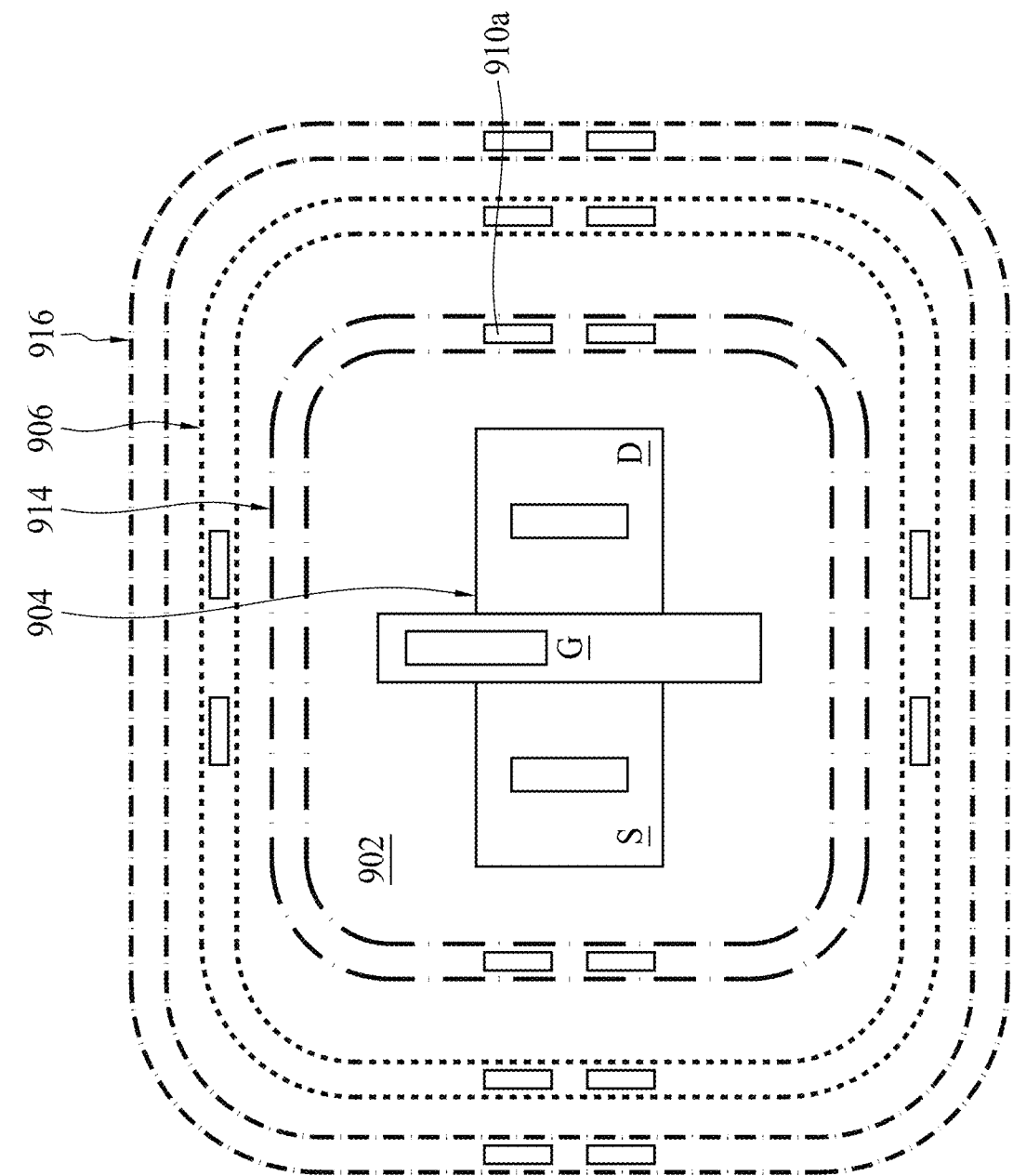
FIG. 9 is a top view of a semiconductor structure in accordance with some embodiments of the present disclosure.

In accordance with some embodiments of the present disclosure, FIG. 9 is a top view of a semiconductor structure 900. With reference to FIG. 9, in some embodiments, the semiconductor structure 900 includes a semiconductor substrate 902, a transistor 904, an antifuse structure 906, a ground electrode structure 914 and a driving electrode structure 916.

The semiconductor substrate 902, the transistor 904 and the antifuse structure 906 are similar to the semiconductor substrate 602, the transistor 604 and the antifuse structure 606 in FIG. 6, and repeated description thereof is omitted for brevity.

The difference between the semiconductor structure 900 and the semiconductor structure 600 in FIG. 6 is that the antifuse structure 906 encloses the ground electrode structure 914 and the transistor 904. In other words, the antifuse structure 906 is located outside of the ground electrode structure 914. In short, the antifuse structure 906 may be formed at a different location depending on the needs or the manufacturing operations.

Figure 10:
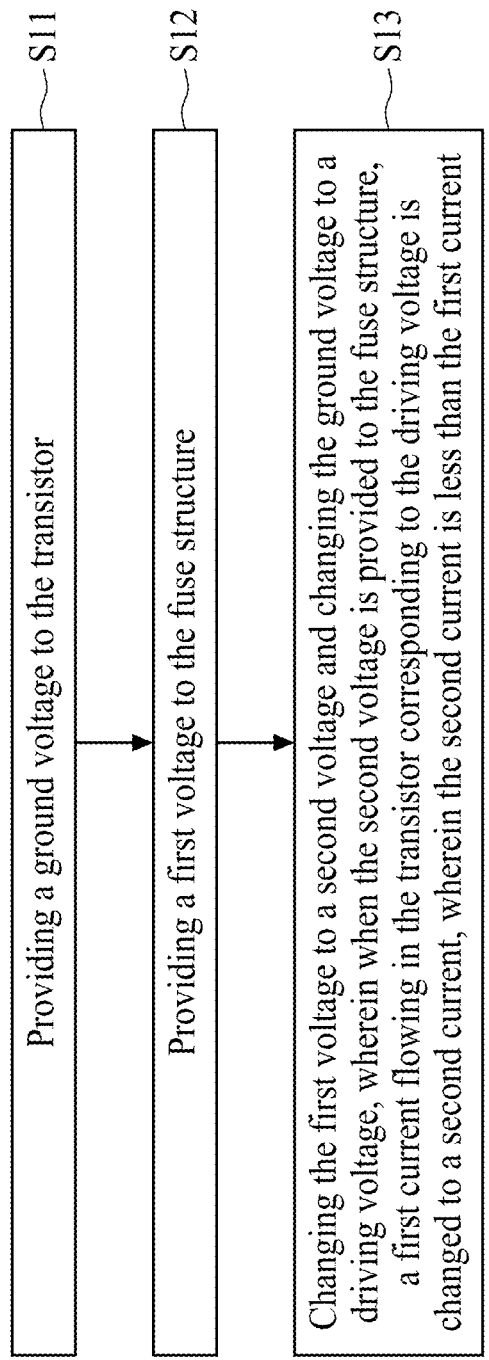
FIG. 10 is a flowchart illustrating a controlling method of the semiconductor structure in FIG. 7.

In accordance with some embodiments of the present disclosure, FIG. 10 is a flowchart illustrating a controlling method of the semiconductor structure 600 in FIG. 7.

Referring to FIG. 10, in some embodiments, the controlling method 10 includes operations S11 to S13. In operation S11, a ground voltage is provided to the transistor. In operation S12, a first voltage is provided to the antifuse structure. In operation S13, the first voltage is changed to a second voltage and the ground voltage is changed to a driving voltage. When the second voltage is provided to the antifuse structure, a first current flowing in the transistor corresponding to the driving voltage is changed to a second current, wherein the second current is less than the first current.

Figure 11:
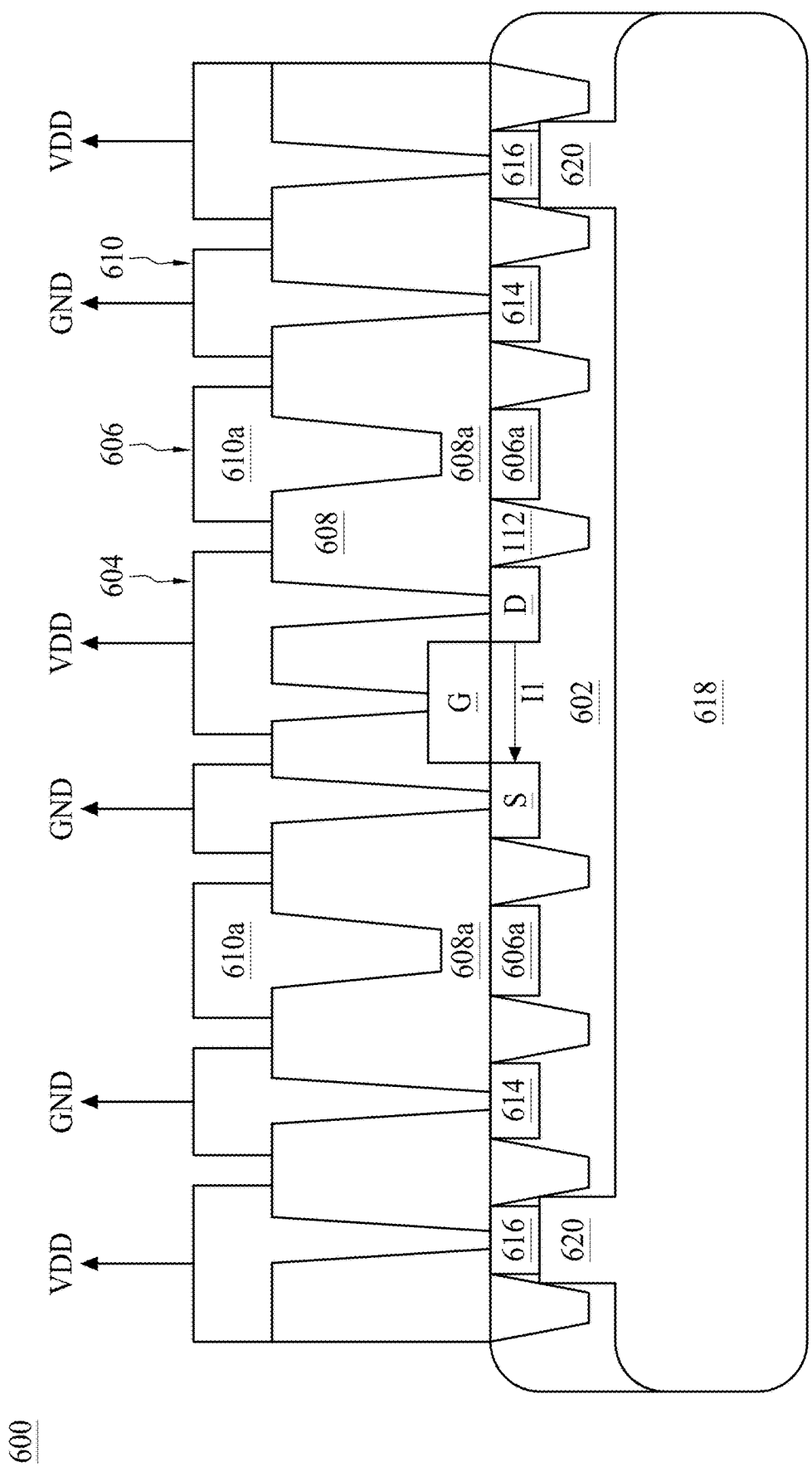
FIG. 11, FIG. 12, FIG. 13 and FIG. 14 are cross-sectional views of the semiconductor structure in FIG. 7 at various states of the controlling operations.

In accordance with some embodiments of the present disclosure, FIG. 11, FIG. 12, FIG. 13 and FIG. 14 show the semiconductor structure 600 in FIG. 7 at various states of the controlling operations. Referring to FIG. 11, in some embodiments, before the providing of the ground voltage GND to the transistor 604, a driving voltage VDD is provided to the transistor 604. In some embodiments, the driving voltage VDD provided to the transistor 604 (for example, an NMOSFET) may be about 1.2 V. It should be understood that the driving voltage VDD is not limited; the driving voltage VDD may be different with different kinds of transistor. When the driving voltage VDD is provided to the transistor 604, a first current I1 flows through the transistor 604.

Figure 12:
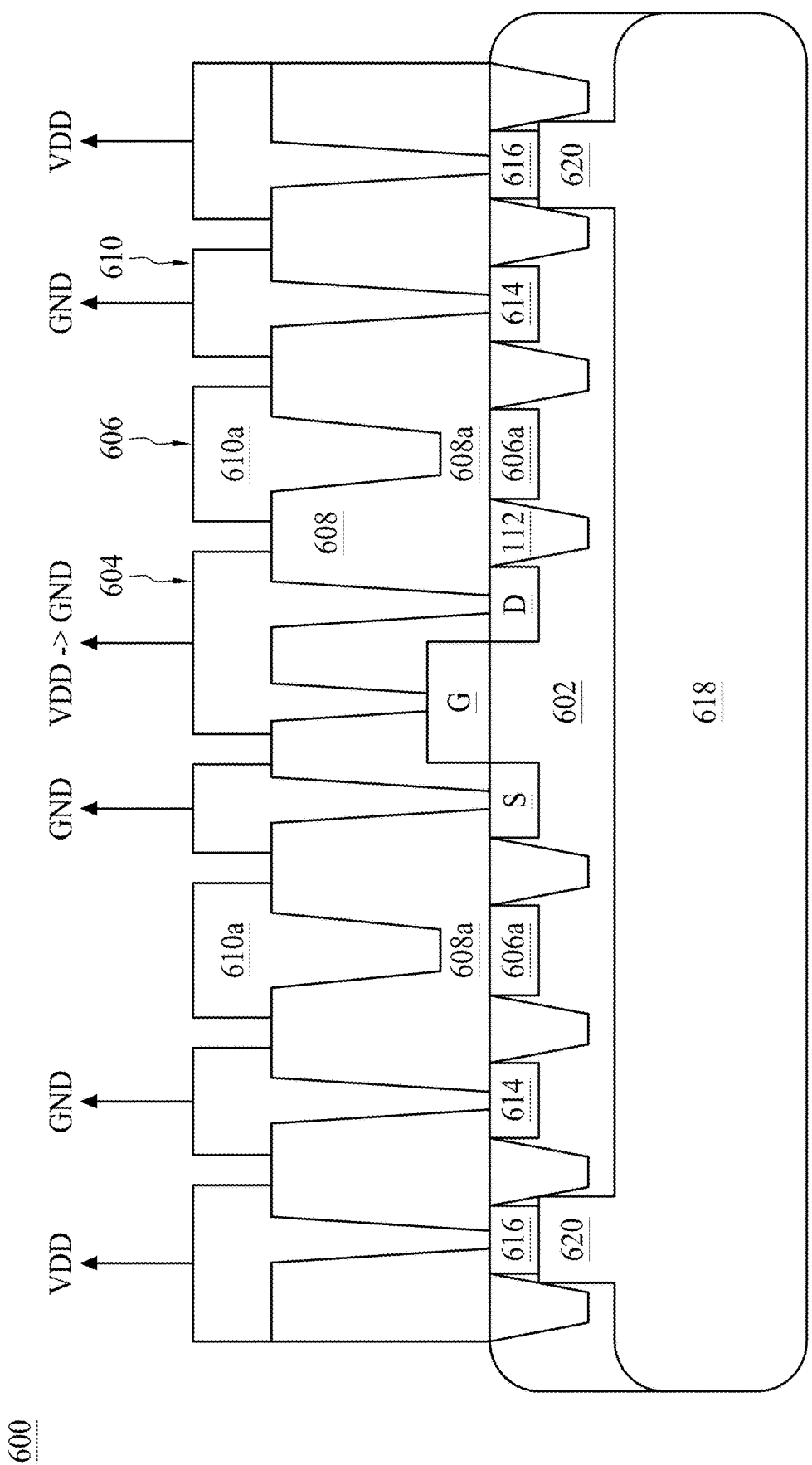

Referring to FIG. 12 and operation S11 in FIG. 10, in operation S11, the ground voltage GND is provided to the transistor 604. In some embodiments, the driving voltage VDD is changed from the driving voltage VDD to the ground voltage GND.

Figure 13:
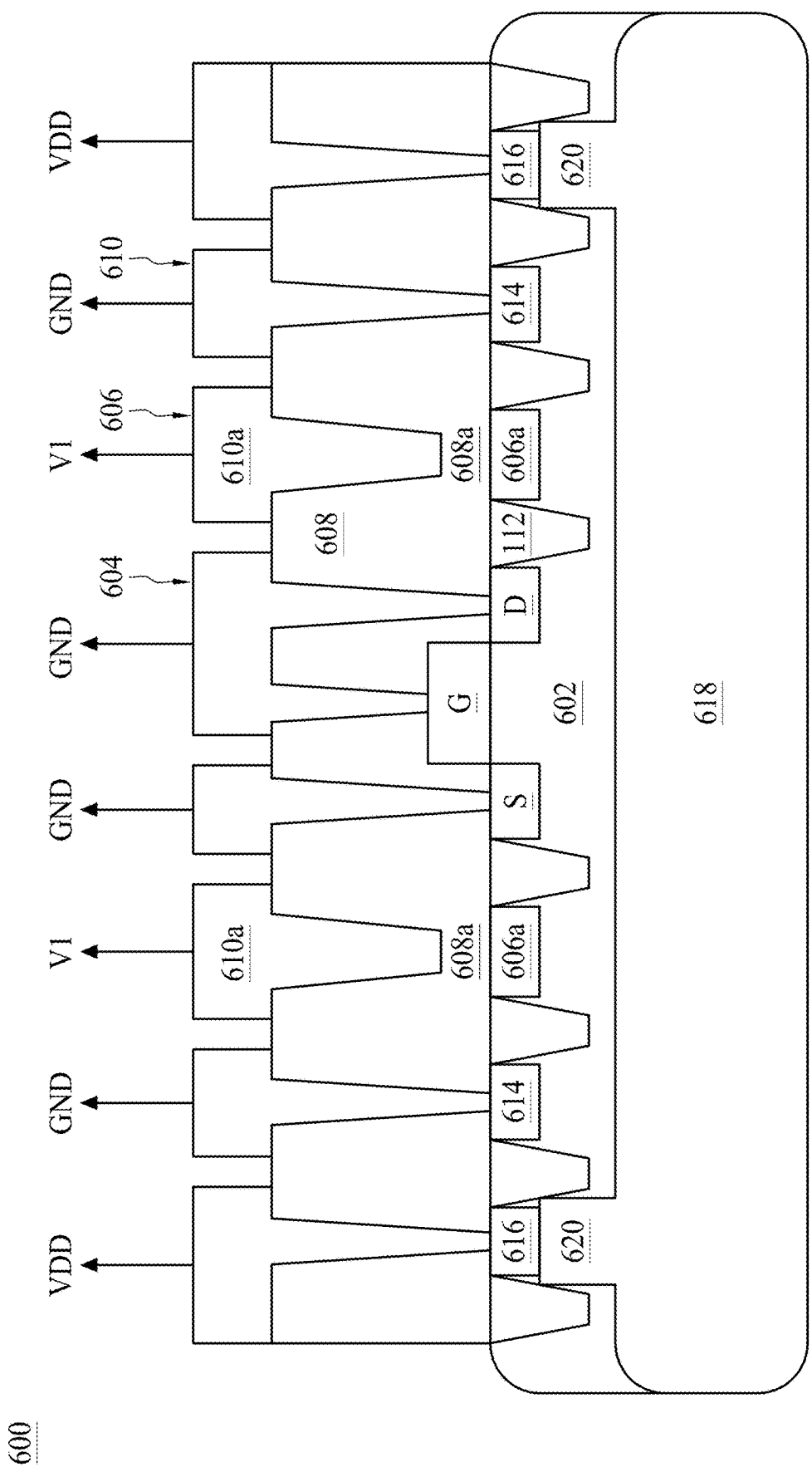

Referring to FIG. 13 and operation S12 in FIG. 10, in operation S12, the first voltage V1 is provided to the antifuse structure 606. In some embodiments, when the first voltage V1 is provided to the antifuse structure 606, the driving voltage VDD is changed to the ground voltage GND. In other words, the transistor 604 is turned off when the first voltage V1 is provided to the antifuse structure 606.

In some embodiments, the first voltage V1 is related to the thickness of the fusible portion 608a as shown by equation (1):

$$E = V1/d \tag{1}$$

Where E is the electric field, V1 is the first voltage V1 and d is the thickness of the fusible portion 608a.

It should be understood that the first voltage V1 is not limited; the first voltage V1 may be different with different conductive types of the first conductive portion 606a. For example, but not limited to, when the first conductive portion 606a is a P-type diffusion region, the first voltage V1 for rupturing the fusible portion 608a may be between about 4.2 V and about 5 V. In some other embodiments, the first voltage V1 for rupturing the fusible portion 608a may be about 6 V. It should be noted that when the first conductive portion 606a is an N-type diffusion region, the first voltage V1 may be a negative voltage compared to the P-type diffusion region.

Figure 14:
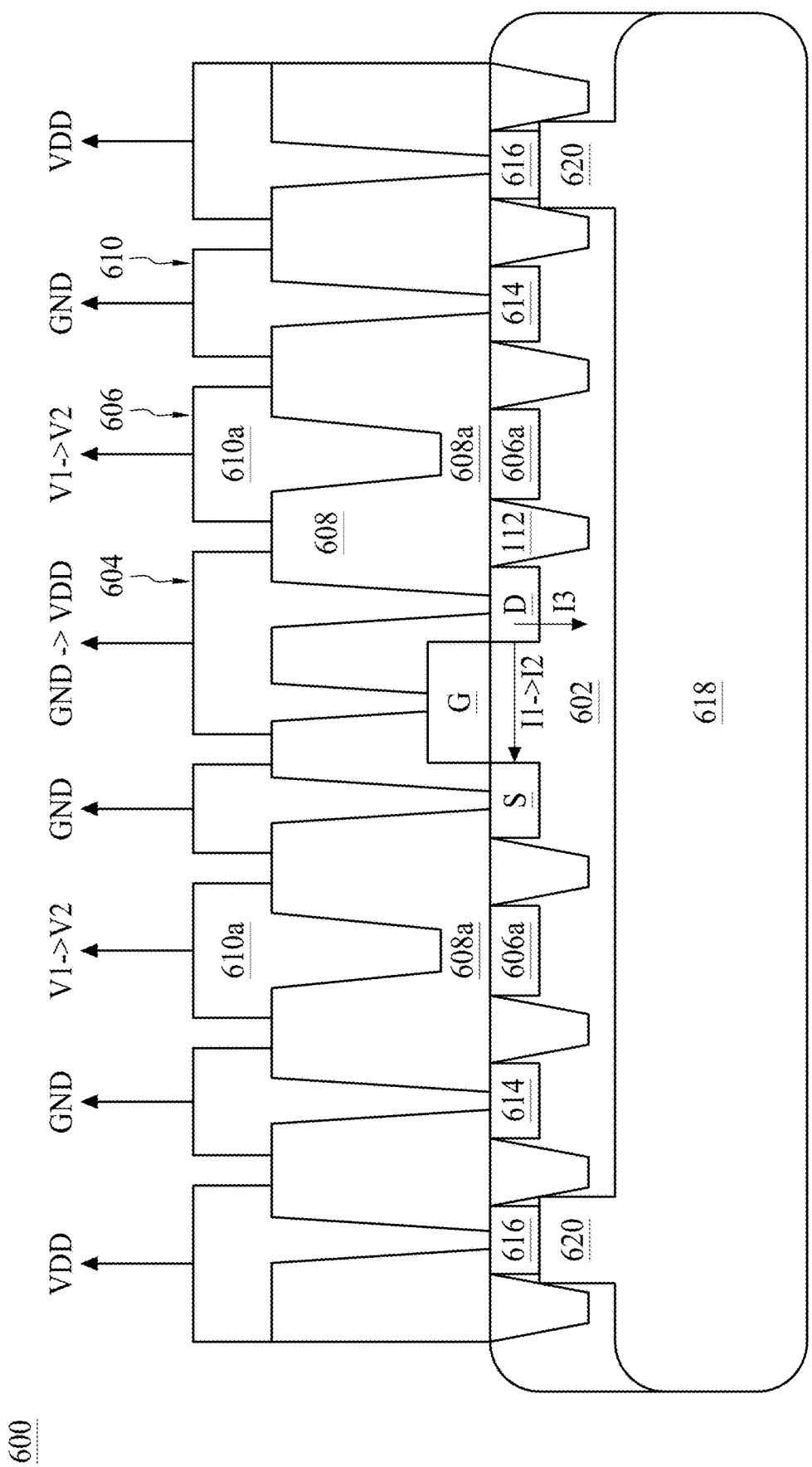

Referring to FIG. 14 and operation S13 in FIG. 10, in operation S13, the first voltage V1 is changed to a second voltage V2 and the ground voltage GND is changed to the driving voltage VDD. In other words, the transistor 604 turns on when the second voltage V2 is provided to the antifuse structure 606.

In some embodiments, when the second voltage V2 is provided to the antifuse structure 606, the first current I1 flowing in the transistor 604 corresponding to the driving voltage VDD is changed to a second current I2. The second current I2 is less than the first current I1.

In some embodiments, when the second voltage V2 is provided to the antifuse structure 606, the antifuse structure 606 is changed from a first state to a second state. The first state is one in which the second conductive portion 610a is electrically isolated from the first conductive portion 606a by the fusible portion 608a. The second state is one in which the second conductive portion 610a is electrically connected to the first conductive portion 606a. In other words, when the antifuse structure 606 is in the second state, the fusible portion 608a is ruptured.

It should be understood that the second voltage V2 is not limited; the second voltage V2 may be different with different conductive types of the first conductive portion 606a. For example, but not limited to, when the first conductive portion 606a is a P-type diffusion region, the second voltage V2 may be about −0.5 V. It should be noted that when the first conductive portion 606a is an N-type diffusion region, the second voltage V2 may be a positive voltage compared to the P-type diffusion region.

As described above, the second voltage V2 from the second conductive portion 610a of the antifuse structure 606 may influence the current flowing through the semiconductor substrate 102 between the source electrode S and the drain electrode D of the transistor 604. For example, the first current I1 flowing in the transistor 604 corresponding to the driving voltage VDD may be changed to the second current I2. As a result, whether the antifuse structure 606 is ruptured or not may be determined from the current flowing in the transistor 604.

Specifically, when the fusible portion 608a is ruptured, the second current I2, which is less than the first current I1, is detected in the transistor 604. The influence on the transistor 604 may be conducted from the semiconductor substrate 602. This is because when the potential of the semiconductor substrate 602 becomes more negative (as in an NMOSFET), more holes are attracted to the semiconductor substrate 602. The threshold voltage of the transistor 604 is changed and the holes may be attracted to the drain electrode D. When the transistor 604 is turned on, a leakage current I3 may occur between the drain electrode D and the semiconductor substrate 602. This effect is called the body effect.

Moreover, when the second current I2 is not less than the first current I1 in a predetermined percentage, an additional operation may be conducted for rupturing the fusible portion 608a. For example, but not limited to, when the second current I2 is greater than 40% of the first current I1 (i.e., when I2>(0.4×I1)), the operation S12 can be performed again. Further, since the current drop is detectable, the voltage provided for the repeated operation of rupturing the fusible portion 608a is adjustable. In other words, when the second current I2 is less than the first current I1 but the current drop is greater than the predetermined percentage, a lower voltage may be provided for the repeated operation of rupturing the fusible portion 608a.

In summary, in the present disclosure, the antifuse structure 606 is re-fusible and the ruptured state of the antifuse structure 606 is detectable through the current flowing in the transistor 604.

Figure 15:
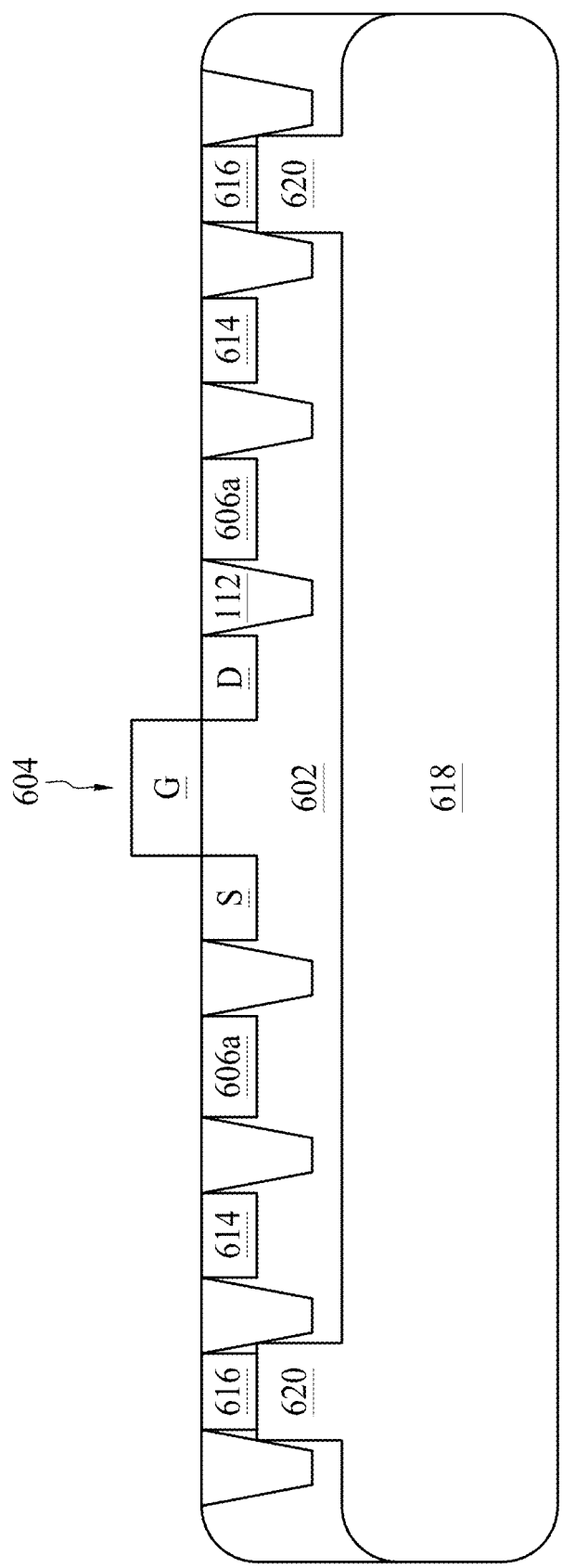
FIG. 15, FIG. 16, FIG. 17, FIG. 18, FIG. 19 and FIG. 20 are cross-sectional views of the semiconductor structure in FIG. 6 along a line A-A at various stages of manufacture.

In accordance with some embodiments of the present disclosure, FIG. 15, FIG. 16, FIG. 17, FIG. 18, FIG. 19 and FIG. 20 are cross-sectional views of the semiconductor structure 600 along a line A-A in FIG. 6 at various stages of manufacture. Referring to FIG. 15, the transistor 604, the first conductive portion 606a of the antifuse structure 606, the ground electrode structure 614, the driving electrode structure 616, the deep N well 618, the N well 620 and the STI region 112 are formed. The elements mentioned may be formed in different operations or the same operation. It should be noted that the first conductive portion 606a and the ground electrode structure 614 are the same conductive type and thus may be formed in the same operation.

Figure 16:
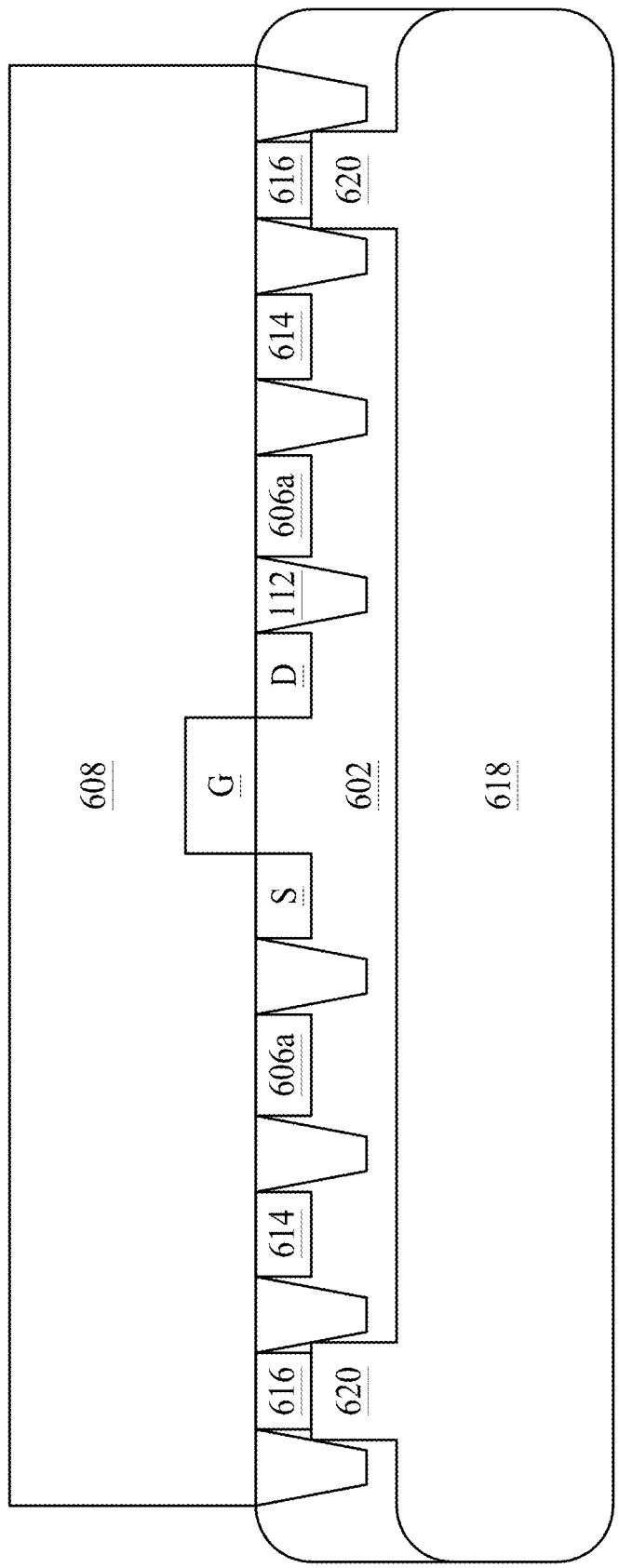

Referring to FIG. 16, the insulating layer 608 is formed on the semiconductor substrate 602 and covers the transistor 604, the first conductive portion 606a, the ground electrode structure 614, and the driving electrode structure 616. The insulating layer 608 may include dielectric materials, such as oxide, nitride, polymer or the like.

Figure 17:
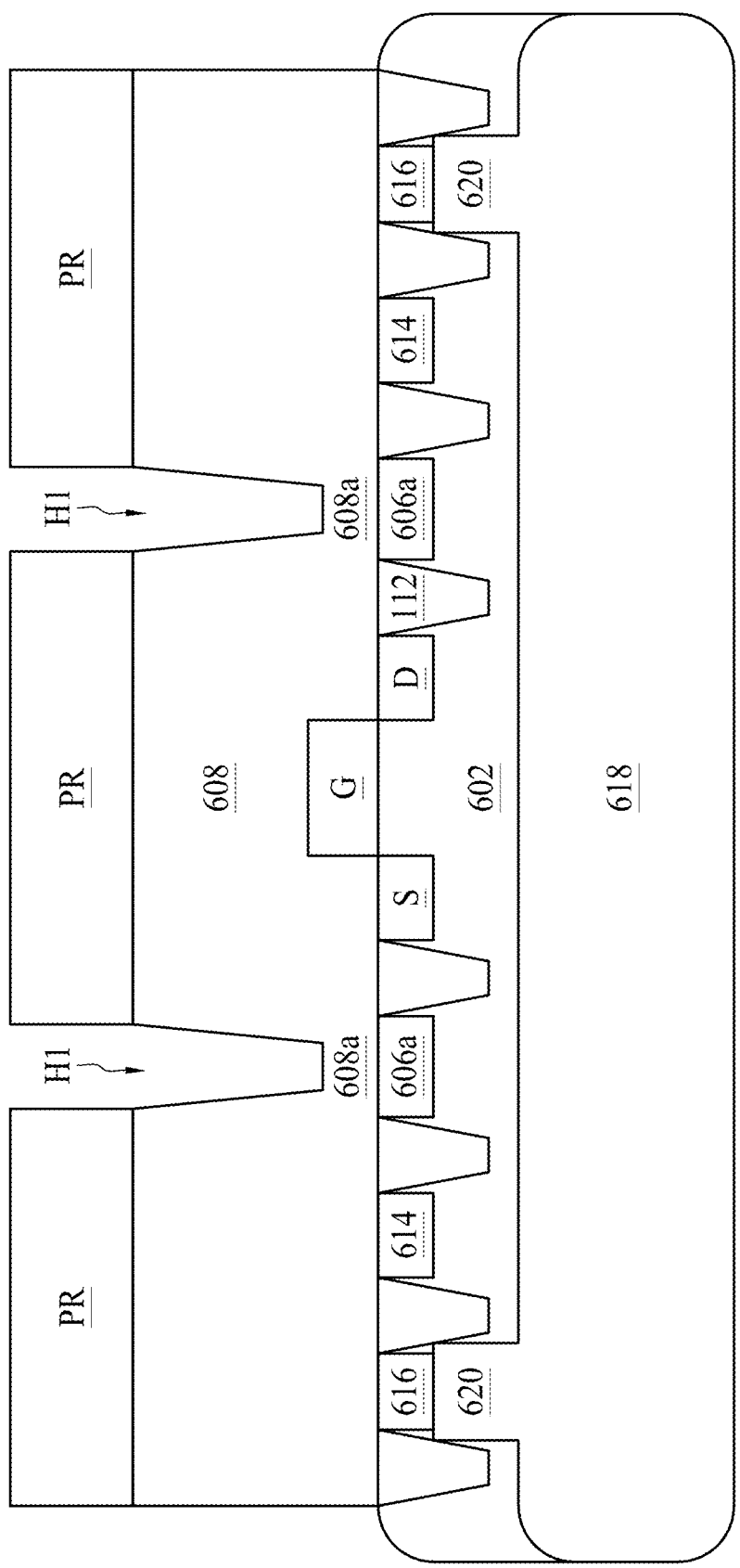
Figure 18:
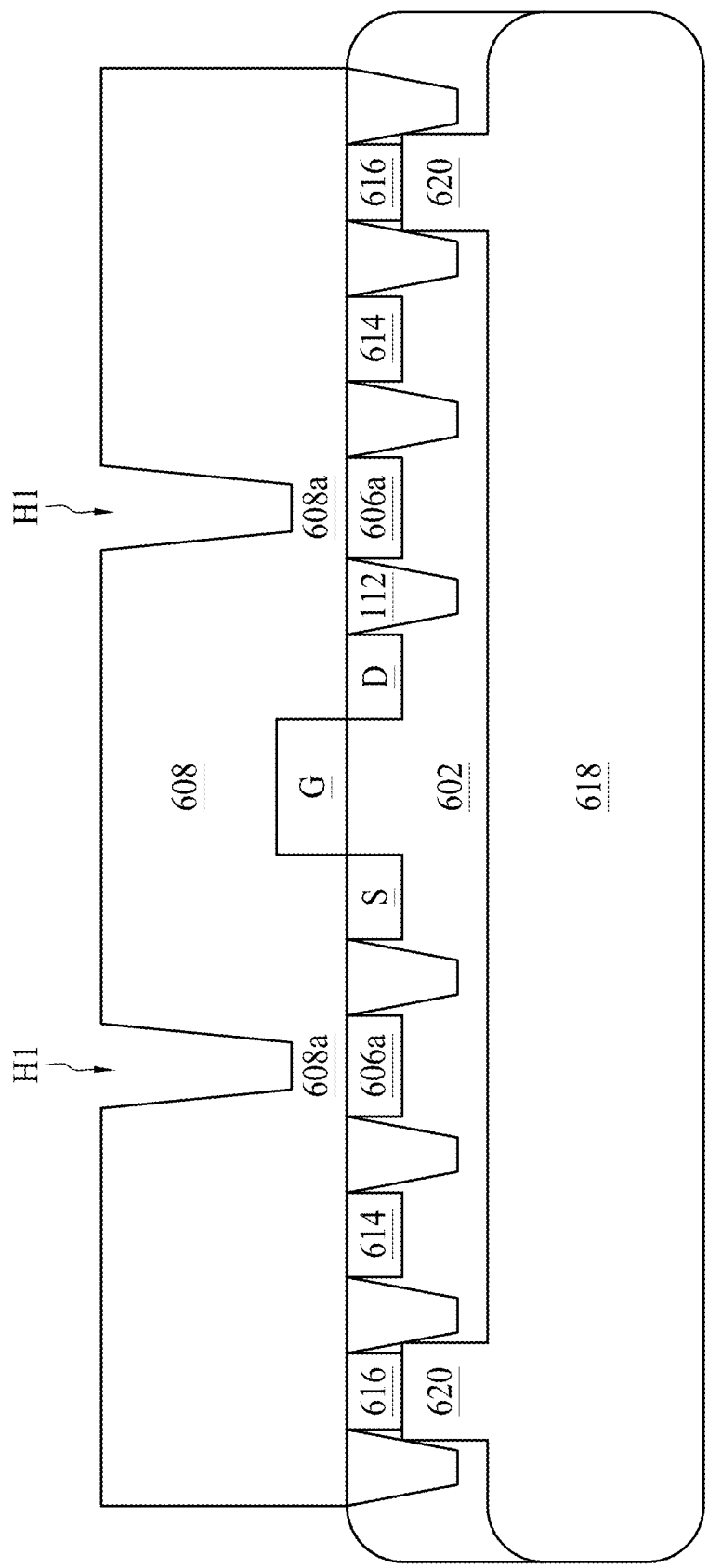

Referring to FIG. 17, a plurality of contact holes H1 are formed in the insulating layer 608 corresponding to the first conductive portion 606a. In some embodiments, a photoresist layer PR is formed for patterning the contact holes H1 on the insulating layer 608. It should be understood that the quantity and location of the contact holes H correspond to the second conductive portion 610a (shown in FIG. 7). In some embodiments, the contact holes H1 do not extend into the upper surface of the first conductive portion 606a. In other words, a portion of the insulating layer 608 below the contact holes H1 is left intact to serve as the fusible portion 108a. Referring to FIG. 18, the photoresist layer PR is removed after the contact holes H1 are formed.

Figure 19:
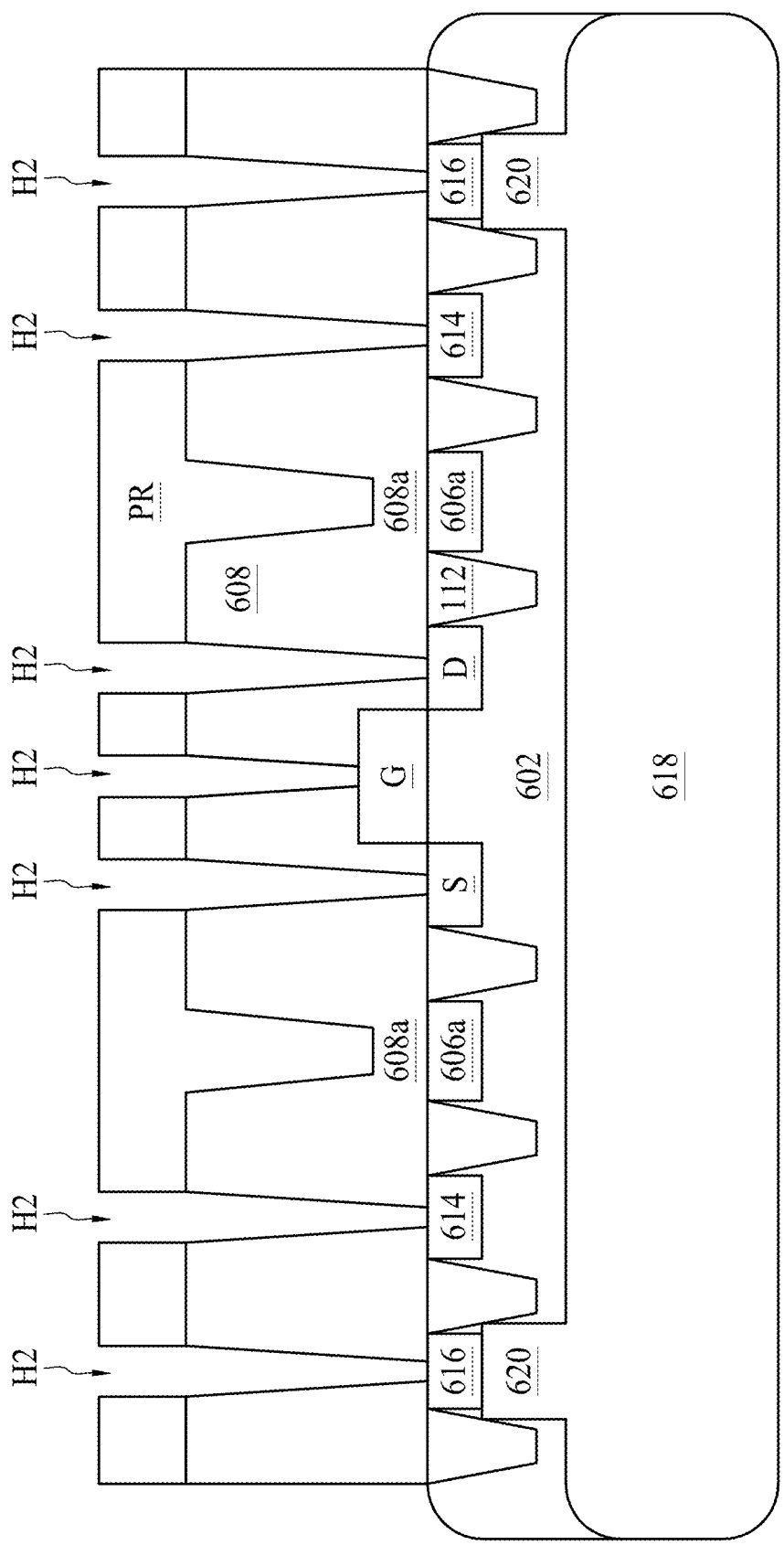

Referring to FIG. 19, a plurality of contact holes H2 are formed in the insulating layer 608 corresponding to the transistor 604, the ground electrode structure 614 and the driving electrode structure 616. In some embodiments, the photoresist layer PR is formed for patterning the contact holes H2 on the insulating layer 608. The photoresist layer PR is removed after the contact holes H2 are formed.

Figure 20:
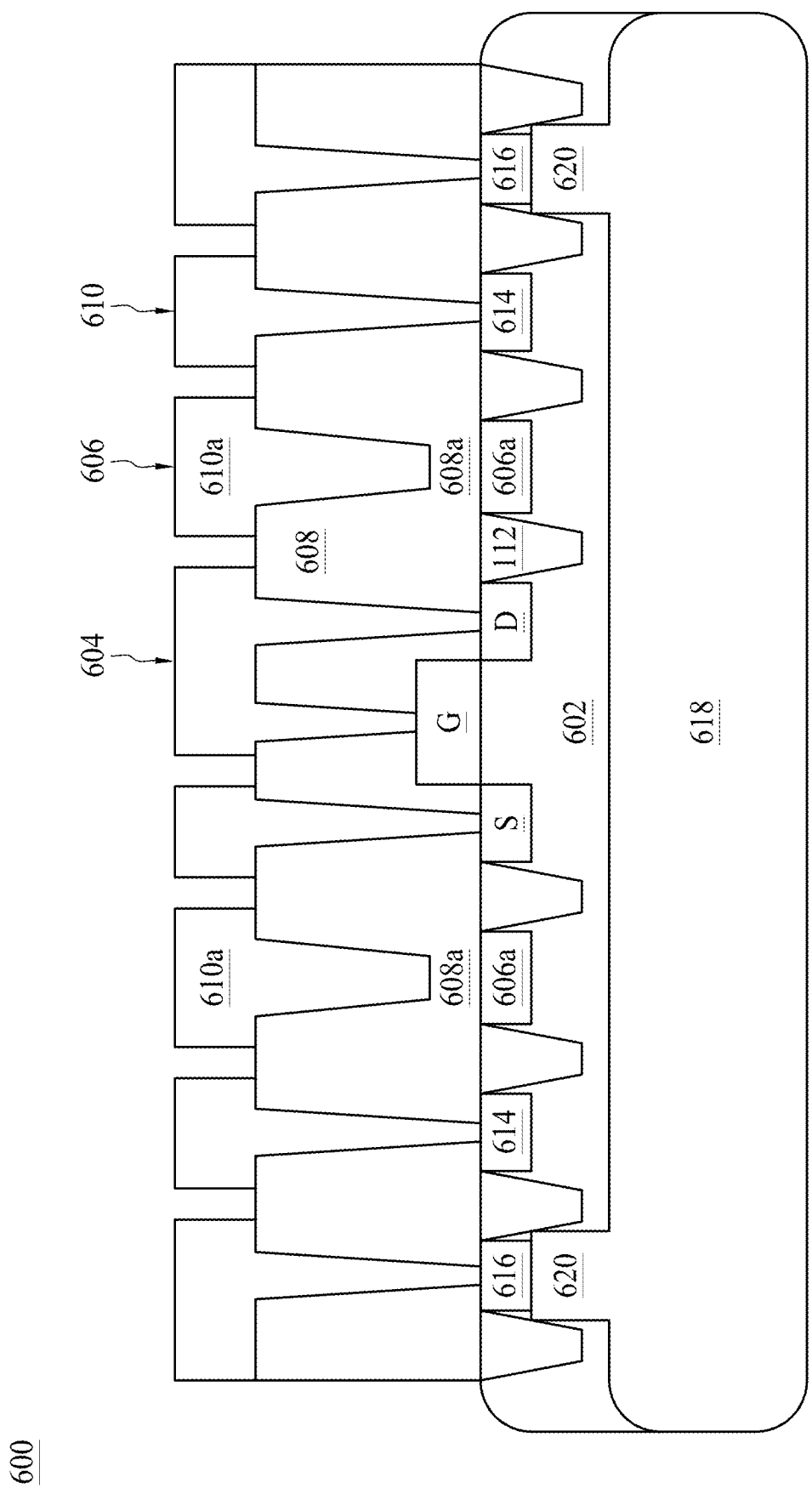

Referring to FIG. 20, the contact plug layer 610 is formed on the insulating layer 608. The contact plug layer 610 is formed in the contact holes H1 and H2 of the insulating layer 108. The contact plug layer 610 is used to electrically connect the transistor 604 and the antifuse structure 606 to other electrical elements. In some embodiments, the contact plug layer 610 is formed by filling the contact holes H1 and H2 with conductive material such as tungsten (W), gold (Au), silver (Ag), another suitable conductive material, or a combination thereof.

It should be understood that the embodiments described in reference to FIG. 8 may be formed using the manufacturing operations described in reference to FIG. 15, FIG. 16, FIG. 17, FIG. 18, FIG. 19 and FIG. 20.

In summary, the area of the antifuse structure 606 may be less than the area of the comparative antifuse structure 406 in FIG. 4. Thus, the dimension of the semiconductor structure 600 may be decreased compared to the comparative semiconductor structure 400. Moreover, the first conductive portion 606a of the antifuse structure 606 and the ground electrode structure 614 may be formed in the same operation and thus the manufacturing operations may be decreased.

It should be understood that the embodiments described in reference to FIG. 8 and FIG. 9 may also be formed using the manufacturing operations described in reference to FIG. 15, FIG. 16, FIG. 17, FIG. 18, FIG. 19 and FIG. 20.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein, may be utilized according to the present disclosure. Accordingly, the appended claims are intended to include within their scope such processes, machines, manufacture, compositions of matter, means, methods, and steps.

What is claimed is:

1. A semiconductor structure, comprising:
a semiconductor substrate;
a transistor, disposed on the semiconductor substrate; and
an antifuse structure, disposed on the semiconductor substrate and adjacent to the transistor, the antifuse structure comprising:
a first conductive portion, disposed in the semiconductor substrate;
a fusible portion, disposed on the first conductive portion; and
a second conductive portion, disposed on the fusible portion,
wherein the antifuse structure encloses the transistor in a top view.

2. The semiconductor structure of claim 1, further comprising:

a ground electrode structure, disposed on the semiconductor substrate and electrically connected to the transistor; and
a driving electrode structure, disposed on the semiconductor substrate and electrically connected to the transistor.

3. The semiconductor structure of claim 2, wherein the ground electrode structure encloses the antifuse structure and the transistor.

4. The semiconductor structure of claim 2, wherein the antifuse structure encloses the ground electrode structure and the transistor.

5. The semiconductor structure of claim 2, wherein the ground electrode structure is provided with a ground voltage and the driving electrode structure is provided with a driving voltage.

6. The semiconductor structure of claim 1, wherein the first conductive portion of the antifuse structure encloses the transistor in the top view.

7. The semiconductor structure of claim 1, wherein when the fusible portion is ruptured, the second conductive portion and the semiconductor substrate are electrically connected.

8. The semiconductor structure of claim 1, wherein when the fusible portion is ruptured, a first current flowing in the transistor is changed to a second current, wherein the second current is less than the first current.

9. A semiconductor structure, comprising:
a semiconductor substrate;
a transistor, disposed on the semiconductor substrate; and
an antifuse structure, disposed on the semiconductor substrate and adjacent to the transistor, the antifuse structure comprising:
a first conductive portion, disposed in the semiconductor substrate;
a fusible portion, disposed on the first conductive portion;
a second conductive portion, disposed on the fusible portion,
a ground electrode structure, disposed on the semiconductor substrate and electrically connected to the transistor; and
a driving electrode structure, disposed on the semiconductor substrate and electrically connected to the transistor
wherein when the antifuse structure is changed from a first state to a second state, a first current flowing in the transistor is changed to a second current, wherein the second current is less than the first current.

10. The semiconductor structure of claim 9, wherein the ground electrode structure encloses the antifuse structure and the transistor.

11. The semiconductor structure of claim 9, wherein the antifuse structure encloses the ground electrode structure and the transistor.

12. The semiconductor structure of claim 9, wherein the ground electrode structure is provided with a ground voltage and the driving electrode structure is provided with a driving voltage.

13. The semiconductor structure of claim 9, wherein the first conductive portion of the antifuse structure encloses the transistor in the top view.

14. The semiconductor structure of claim 9, wherein when the fusible portion is ruptured, the antifuse structure is changed from the first state to the second state.

15. A controlling method of a semiconductor structure, the semiconductor structure comprising a transistor and an antifuse structure, the method comprising:

providing a ground voltage to the transistor;
providing a first voltage to the antifuse structure; and
changing the first voltage to a second voltage and changing the ground voltage to a driving voltage,
wherein when the second voltage is provided to the antifuse structure, a first current flowing in the transistor corresponding to the driving voltage is changed to a second current, wherein the second current is less than the first current.

16. The method of claim 15, wherein when the second voltage is provided to the antifuse structure, the antifuse structure is changed from a first state to a second state.

17. The method of claim 16, wherein when the antifuse structure is in the second state, a fusible portion of the antifuse structure is ruptured.

18. The method of claim 17, wherein when the first voltage is provided to the antifuse structure, the driving voltage is changed to the ground voltage.

19. The method of claim 15, wherein before the providing of the ground voltage to the transistor, the driving voltage is provided to the transistor.

\* \* \* \* \*